United States Patent [19]
Mizukami

[11] Patent Number: 6,100,789
[45] Date of Patent: Aug. 8, 2000

[54] FIRE CONTROL AND INDICATING EQUIPMENT

[75] Inventor: Akira Mizukami, Tokyo, Japan

[73] Assignee: Nohmi Bosai Ltd., Tokyo, Japan

[21] Appl. No.: 09/332,095

[22] Filed: Jun. 14, 1999

[30] Foreign Application Priority Data

Jun. 15, 1998 [JP] Japan .................................. 10-167124

[51] Int. Cl.⁷ ................................................ G08B 25/00
[52] U.S. Cl. ............................................................ 340/287
[58] Field of Search ................................... 340/287, 584, 340/587

[56] References Cited

U.S. PATENT DOCUMENTS 4,724,629  2/1988  Walton ...................................... 40/451
5,461,367 10/1995  Altavela et al. ......................... 340/584
5,982,275 11/1999  Kosich ..................................... 340/293

*Primary Examiner*—Edward Lefkowitz
*Attorney, Agent, or Firm*—Wenderoth, Lind & Ponack, L.L.P.

[57] ABSTRACT

In a fire control and indicating equipment, a printed circuit board is so formed as to be larger in plane than an operation panel, engagement holes are defined in the printed circuit board, and engagement portions corresponding to the engagement holes are disposed on the back surface side of the operation panel. The engagement of the engagement holes with the engagement portion allows the printed circuit board and the operation panel to be integrated together in a state where the operation panel is mounted on the printed circuit board to form a unit body. The printed circuit board of the unit body is fixed onto a printed-board fixing section.

11 Claims, 4 Drawing Sheets

FIRE CONTROL AND INDICATING EQUIPMENT

BACKGROUND OF THE INVENTION

1. Field of the Invention

The present invention relates to a fire control and indicating equipment (or a fire alarm panel) that is electrically connected to a variety of terminal devices such as a fire detector or a transmitter that connects the fire detector to alarm the occurrence of a fire upon receiving a variety of signals from those terminal devices. More particularly, the present invention relates to the structure of a fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing having a front cover that can be freely opened and closed.

2. Description of the Related Art

In a conventional fire control and indicating equipment, a printed circuit board is fixed onto a printed-board fixing section fitted onto a bottom surface of a casing, and an operation panel is appropriately formed on a back surface of a front cover of the casing or the like, resulting in such a drawback that the circuit components, etc., are complicatedly installed so that the printed circuit board that is relatively brittle is bent or broken.

Also, the drawback leads to the prevention of an improvement in productivity such as assembling or fastening works in a manufacturing stage.

Also, because a large-scaled circuit component, etc., are required to be equipped on the printed circuit board, the eguipment is thickened, thereby making it difficult to provide a downsized fire control and indicating equipment having the thin eguipment.

Further, because the circuit components, etc., are complicatedly installed, there arises such a drawback that it takes much time to execute the replacement of the components or the maintenance and inspection works.

In addition, in the conventional fire control and indicating equipment, since the printed circuit board is disposed on the bottom surface of the casing and the operation panel is disposed on the back surface of the front cover in a built-in manner, there arise such drawbacks that if a large-sized and high component is to be disposed on the printed circuit board, the component cannot be received in the casing because it is high, and if the model or the specification of a component for replacement is altered, the fire control and indicating equipment as located cannot be employed.

SUMMARY OF THE INVENTION

The present invention has been made to eliminate the drawbacks as described above, and therefore an object of the present invention is to provide a downsized fire control and indicating equipment (or a fire alarm panel) which is simple in structure and ready in manufacture and maintenance/inspection.

According to a first aspect of the present invention, there is provided a fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing, characterized in that the printed circuit board is so formed as to be larger in plane than the operation panel, an engagement hole is defined in the printed circuit board, an engagement portion corresponding to the engagement hole is provided at a back surface side of the operation panel, the printed circuit board and the operation panel are integrated together, by the engagement of the engagement hole with the engagement portion, in a state where the operation panel is fixedly mounted on the printed circuit board to form a unit body, and the printed circuit board of the unit body is fixed onto the printed-board fixing section.

According to a second aspect of the present invention, there is provided a fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing, characterized in that the printed circuit board is so formed as to be larger in plane than the operation panel, the operation panel is fixedly mounted on the printed circuit board, and a circuit component is disposed on the printed circuit board except for a region on which the operation panel is mounted.

According to a third aspect of the present invention, there is provided a fire control and indicating equipment as defined in the first or second aspect of the present invention, characterized in that the operation panel is fixed by a fastening member from the back surface side of the printed circuit board.

According to a fourth aspect of the present invention, there is provided a fire control and indicating equipment in which an operation panel having an information indicating function for indicating various kinds of information and an operating function for controlling a variety of related devices, a printed circuit board equipped with required circuit components including a CPU for executing various kinds of information processing and a detachably attached memory device such as an EPROM or an EEPROM and a printed-board fixing section for fixing the printed circuit board are installed in a casing, characterized in that the printed circuit board is so formed as to be larger in plane than the operation panel, the operation panel is fixedly mounted on the printed circuit board, and the memory device is detachably attached onto the printed circuit board except for a region on which the operation panel is mounted.

According to a fifth aspect of the present invention, there is provided a fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing having a front cover which is freely opened and closed, characterized by further comprising a peripheral wall disposed on the operation panel so as to surround the operation panel surface, the peripheral wall including an upper edge formed so as to come close to a back surface of the front cover when the front cover is closed and a window formed so as to enable the operation of the operation panel from the exterior.

According to a sixth aspect of the present invention, there is provided a fire control and indicating equipment as defined in any one of the first to fifth aspects of the present invention, characterized in that the printed-board fixing section is detachably fixed onto the bottom surface of the casing with a gap defined therebetween.

BRIEF DESCRIPTION OF THE DRAWINGS

These and other objects, features and advantages of this invention will become more fully apparent from the following detailed description taken with the accompanying drawings in which.

DETAILED DESCRIPTION OF THE PREFERRED EMBODIMENTS

Now, a description will be given in more detail of a preferred embodiment of the present invention with reference to the accompanying drawings.

Figure 1:
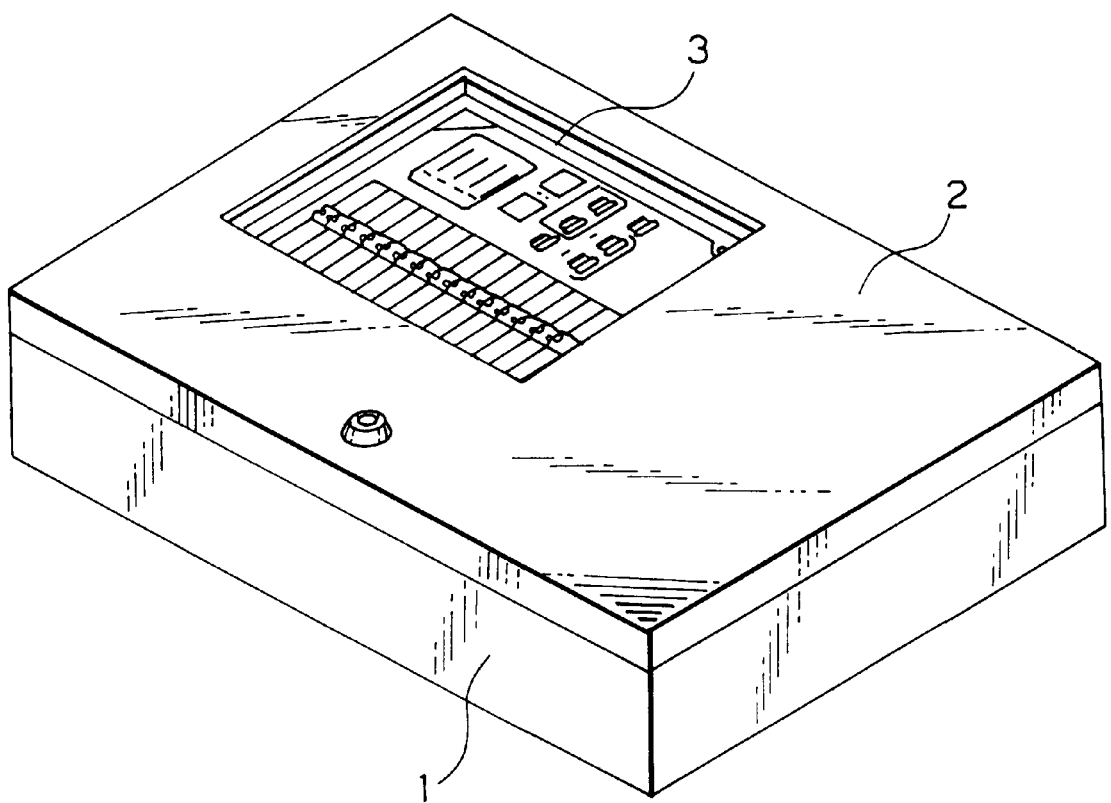
FIG. 1 is a perspective view showing a fire control and indicating equipment.
Figure 2:
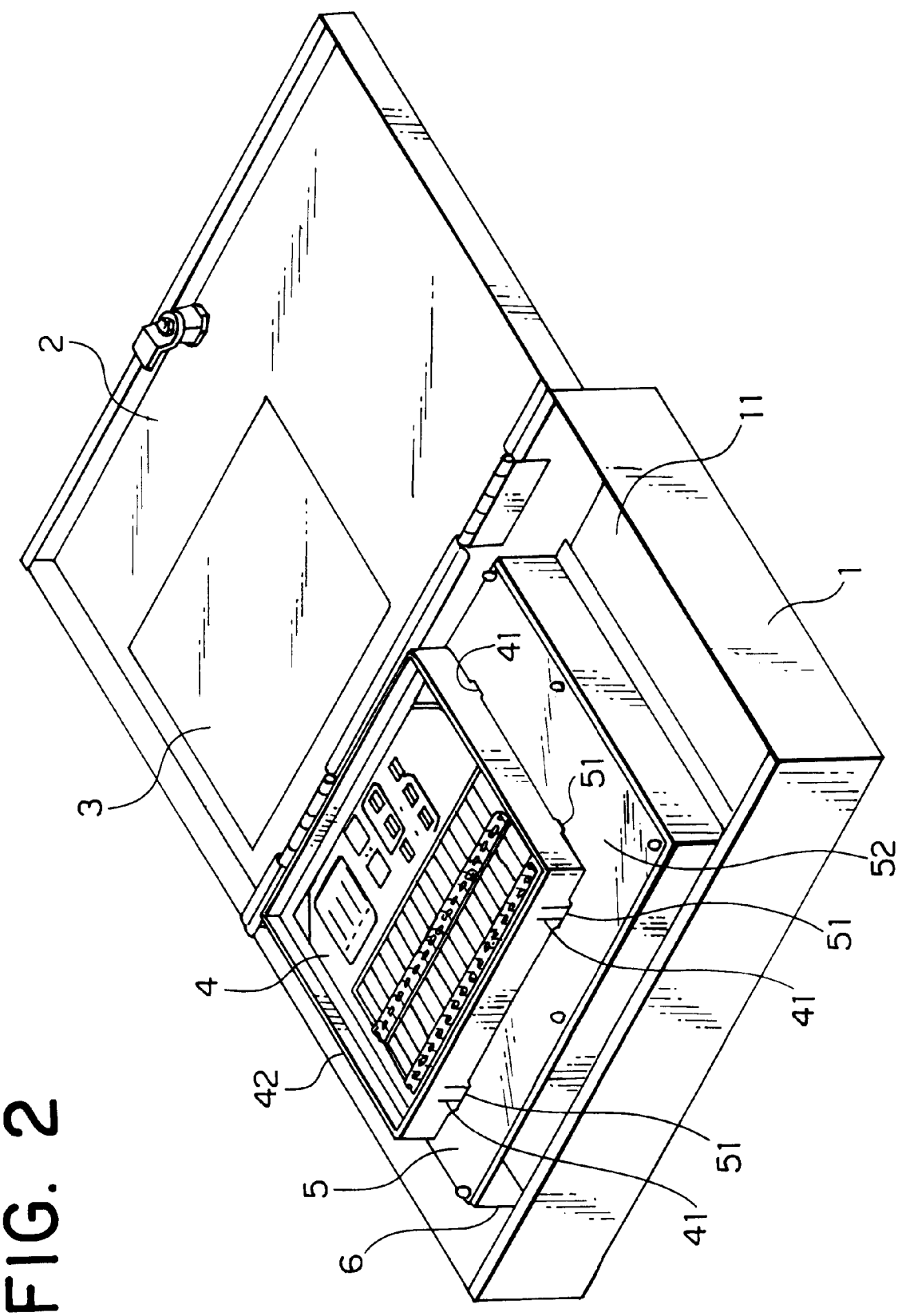
FIG. 2 is a perspective view showing a state in which a front cover is opened.
Figure 3:
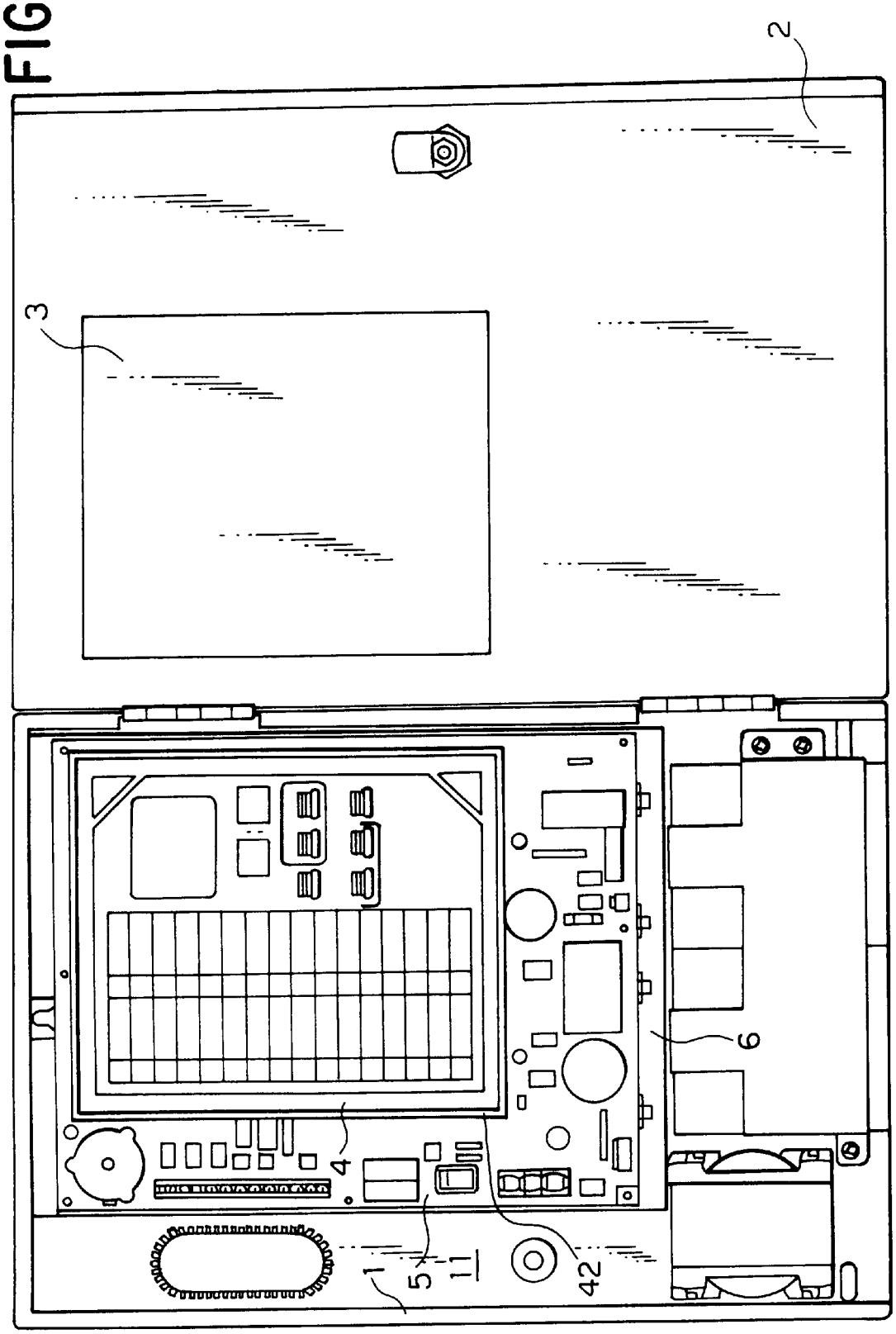
FIG. 3 is a laterally cross-sectional view showing the fire control and indicating equipment shown in FIG. 1.
Figure 4:
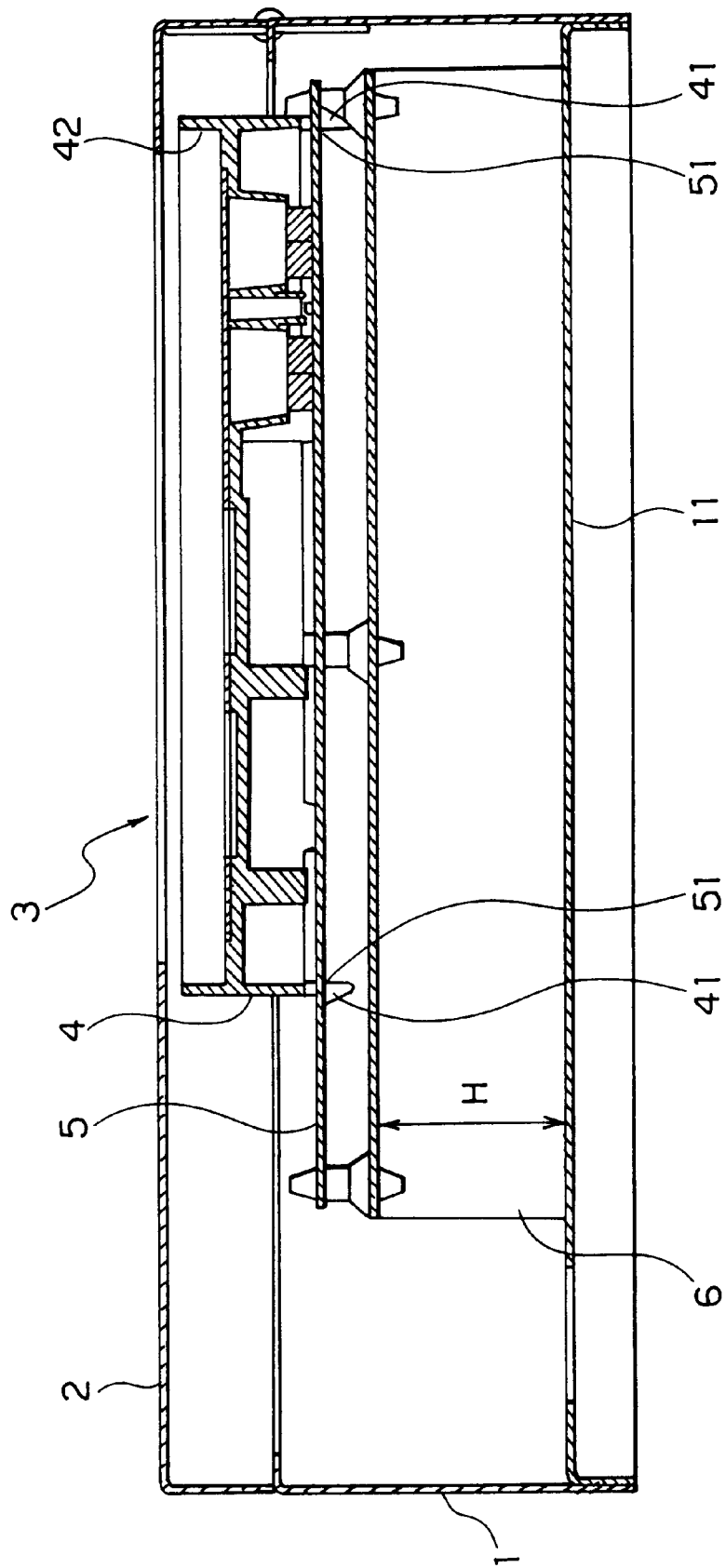
FIG. 4 is a plan view showing a state in which a circuit component is installed.

FIG. 1 is a perspective view showing a fire control and indicating equipment, FIG. 2 is a perspective view showing a state in which a front cover is opened, FIG. 3 is a laterally cross-sectional view showing the fire control and indicating equipment shown in FIG. 1, and FIG. 4 is a plan view showing a state in which a circuit component is installed.

Referring to FIG. 1, reference numeral 1 denotes a casing, 2 is a front cover attached on one side of the casing so as to be freely opened or closed, and 3 is a window defined in the front cover 2. The window 3 is of a size by which a hand or fingers are inserted into the window 3 such that an operation panel 4, which will be described later, disposed within the casing 1 can be operated from the exterior in a state where the front cover 2 is closed.

Referring to FIG. 2, reference numeral 4 denotes the operation panel having an information indicating function for indicating various kinds of information and an operating function for controlling a variety of related devices. Reference numeral 5 denotes a printed circuit board which is equipped with circuit components including a CPU for executing various kinds of information processing and a memory device such as an EPROM or an EEPROM which is detachably equipped. Reference numeral 6 denotes a printed-board fixing section to which the printed circuit board 5 is fixed, and the printed-board fixing section 6 is detachably fitted to a bottom surface 11 of the casing 1 with a gap H there between.

In this example, the operation panel 4 is a panel molded out of synthetic resin and substantially H-shaped in section. Components such as touch switches or LEDs for indication are molded or externally attached onto the front surface side of the operation panel 4 whereas required circuit components, etc., are molded or externally attached onto the back surface side thereof.

A peripheral wall 42 that surrounds the operation panel surface is molded integrally with the operation panel 4, and an upper edge of the peripheral wall 42 is set to be so high as to come close to the back surface of the front cover 2 when the front cover 2 is closed.

The printed circuit board 5 is so formed as to be larger in planar area than the operation panel 4. The printed circuit board 5 and the operation panel 4 are fixed onto each other in a state where the operation panel 4 is mounted on the printed circuit board 5, and are integrated together into a unit body.

In this embodiment, an appropriate number of engagement holes 51 are defined in the printed circuit board 5 whereas a corresponding number of engagement portions 41 are disposed on the back surface side of the operation panel 4 so as to be detachably engaged with those corresponding engagement holes 51. The engagement of the engagement holes 51 with the engagement portions 41 allows the printed circuit board 5 and the operation panel 4 to be integrated together.

In this way, the printed circuit board 5 of the unit body thus integrated is fixed onto the printed-board fixing section 6.

The printed circuit board 5 becomes relatively brittle because the circuit components or the like are complicatedly mounted on the printed circuit board 5. However, the integration of the printed circuit board 5 with the operation panel 4 by putting the operation panel 4 on the circuit board 5 as described above reinforces the printed circuit board 5 to enhance the mechanical strength thereof.

The above description is applied to detachably engaging means as integrating means. However, the integrating means is not limited to this but may be an appropriate general means. For example, although being not shown, the operation board 4 is fixed by fastening members such as screws at appropriate positions from the back surface side of the printed circuit board 5 so that the operation panel 4 and the printed circuit board 5 can be firmly integrated together, and also the reinforcement of the printed circuit board 5 can be further made firm.

Because the operation panel 4 that is small in area is securely mounted on the printed circuit board 5, a relatively high and large-scaled circuit component such as an electrolytic capacitor can be disposed on an area 52 of the printed circuit board 5 where the operation panel 4 is not mounted, within the limit that the circuit component is housed within the casing 1 which is closed by the front cover 2.

If the circuit component is not housed within the casing 1 which is closed by the front cover 2, the printed-board fixing section 6 formed with the gap H defined between the printed-board fixing section 6 and the bottom surface of the casing 1 can be replaced by another printed-board fixing section 6 that allows a smaller gap H to be defined there between, to thereby enable the circuit component to be disposed on the printed circuit board 5.

In addition, since there is no obstacle on the area 52 of the printed circuit board 5 where the operation panel 4 is not mounted except for the front cover 2, if a component which is relatively frequently replaced by a new or another one, such as a CPU that executes various kinds of information processing or a memory device such as an EPROM or an EEPROM is detachably disposed thereon, or a component requiring maintenance/inspection is disposed thereon, those working can be easily conducted merely by opening the front cover 2.

Accordingly, it is necessary to prepare plural types of printed-board fixing sections 6 which are different in the gap H from each other, and also it is preferable that the means for fixing the printed-board fixing section 6 onto the bottom surface 11 of the casing 1 is constituted by a simple means that facilitates attachment/detachment such as a screw fastening type or engaging type.

Although the operation panel 4 and the printed circuit board 5 must be removed once when the printed-board fixing section 6 is replaced by another one, since the operation panel 4 and the printed circuit board 5 are integrated together into a unit body in this invention, removal or assembling work can be quickly and easily conducted.

Although in the above description, the components such as touch switches or LEDs for indication are disposed on the operation panel 4 by molding or external attachment, it is possible that the switches, the LEDs or the like are attached onto the printed circuit board 5, and push bars that push the switches on the printed circuit board 5 or indication windows through which the light emitted from the LEDs are indicated to the external are disposed on or in the operation panel 4. With this structure, since it is needless to provide the circuit components on the operation panel 4, and it is unnecessary to provide electrical wiring such as a lead wire, the assembling of the unit body is facilitated.

As described above, according to the first aspect of the present invention, since the unit body is structured in a state where the operation panel is mounted on the printed circuit board, the printed circuit board which becomes relatively brittle because the circuit components or the like are complicatedly mounted on the printed circuit board can be reinforced in mechanical strength, to thereby make it possible to prevent the printed circuit board from being bent or broken.

Also, since the printed circuit board and the operation panel are structured into the unit body, its handling is convenient, and assembling or fastening works in a manufacturing stage can be efficiently conducted such that the unit body can be electrically connected to a chargeable battery as an auxiliary power supply, a transformer or the like, for example, by only connection using a connector.

According to the second aspect of the present invention, since the printed circuit board is so formed as to be larger in plane than the operation panel, it is unnecessary to locate a high and large-scaled circuit component between the operation panel and the printed circuit board which are put one on another, and the large-scaled component can be mounted on the area of the printed circuit board where the operation panel is not mounted. As a result, the thickness of the equipment can be remarkably reduced as compared with the conventional equipment, thereby making it possible to provide a downsized fire control and indicating equipment.

Also, the component high in the frequency of replacement or in the frequency of maintenance/inspection can be disposed on the area of the printed circuit board where the operation panel is not mounted, thereby making it possible to quickly and readily conduct the replacement of components and the maintenance/inspection work.

According to the third aspect of the present invention, since the operation panel is fixed by the fastening member on the printed circuit board side, the mechanical strength of the printed circuit board can be reinforced by the operation panel, thereby making it possible to prevent the printed circuit board from being bent or broken. Also, the positioning of the switches, the LEDs or the like mounted on the printed circuit board can be quickly and readily conducted.

According to the fourth aspect of the present invention, since the printed circuit board is so formed as to be larger in plane than the operation panel so that the memory device is detachably mounted on the area of the printed circuit board where the operation panel is not mounted, the memory device such as a ROM can be quickly and readily replaced by another one.

According to the fifth aspect of the present invention, since the provision of the peripheral wall on the operation section enables the operation section to be located at a position far from the window of the front cover, appropriate darkness can be obtained, thereby making it possible to relatively brightly and clearly indicate the illumination of the indication lamp such as an LED and also to reduce power consumption.

Also, mischievous or invasion due to foreign matters such as rain can be prevented from entering the internal device from the gap defined between the front cover and the operation panel, thereby making it possible to ensure the safety of the device.

Further, since the operation section is molded out of a synthetic resin or the like, the peripheral wall can be readily provided. As a result, it is unnecessary to manufacture and supply a filler with which the gap is filled, whereby the number of structural parts can be reduced and a time required for attachment can be omitted, thereby making it possible to reduce the manufacturing costs.

According to the sixth aspect of the present invention, since the operation panel and the printed circuit board are integrated into the unit body and fixed onto the printed-board fixing section formed on the bottom of the casing with a gap there between, when a high component is mounted on the printed circuit board, if the unit is not received in the casing because of the height of the component, the printed-board fixing section is replaced by an appropriate printed-board fixing section that is different in height, and the unit body is merely fixedly mounted on the printed-board fixing section, thus being capable of readily adapting the high component.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing, characterized in that said printed circuit board is so formed as to be larger in plane than the operation panel, an engagement hole is defined in said printed circuit board, an engagement portion corresponding to said engagement hole is provided at a back surface side of said operation panel, said printed circuit board and said operation panel are integrated together, by the engagement of the engagement hole with the engagement portion, in a state where said operation panel is mounted on said printed circuit board to form a unit body, and said printed circuit board of said unit body is fixed onto said printed-board fixing section.

2. A fire control and indicating equipment as claimed in claim 1, characterized in that said operation panel is fixed by a fastening member from the back surface side of said printed circuit board.

3. A fire control and indicating equipment as claimed in claim 1, characterized in that said printed-board fixing section is detachably fixed onto said bottom surface of said casing with a gap defined there between.

4. A fire control and indicating equipment as claimed in claim 2, characterized in that said printed-board fixing section is detachably fixed onto said bottom surface of said casing with a gap defined there between.

5. A fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing, characterized in that said printed circuit board is so formed as to be larger in plane than the operation panel, said operation panel is fixedly mounted on said printed circuit board, and a circuit component is disposed on said printed circuit board except for a region on which said operation panel is mounted.

6. A fire control and indicating equipment as claimed in claim 5, characterized in that said operation panel is fixed by a fastening member from the back surface side of said printed circuit board.

7. A fire control and indicating equipment as claimed in claim 5, characterized in that said printed-board fixing section is detachably fixed onto said bottom surface of said casing with a gap defined there between.

8. A fire control and indicating equipment as claimed in claim 6, characterized in that said printed-board fixing section is detachably fixed onto said bottom surface of said casing with a gap defined there between.

9. A fire control and indicating equipment in which an operation panel having an information indicating function for indicating various kinds of information and an operating function for controlling a variety of related devices, a printed circuit board equipped with required circuit components including a CPU for executing various kinds of information processing and a detachably attached memory device or an EEPROM or an EEPROM and a printed-board fixing section for fixing the printed circuit board are installed in a casing, characterized in that said printed circuit board is so formed as to be larger in plane than the operation panel, said operation panel is fixedly mounted on said printed circuit board, and said memory device is detachably attached onto said printed circuit board except for a region on which said operation panel is mounted.

10. A fire control and indicating equipment as claimed in claim 9, characterized in that said printed-board fixing section is detachably fixed onto said bottom surface of said casing with a gap defined there between.

11. A fire control and indicating equipment in which an operation panel having an information indicating function for indicating various kinds of information and an operating function for controlling a variety of related devices, a printed circuit board equipped with required circuit components and a printed-board fixing section for fixing the printed circuit board are installed in a casing having a front cover which is freely opened and closed, characterized by further comprising a peripheral wall disposed on said operation panel so as to surround the operation panel surface, said peripheral wall including an upper edge formed so as to come close to a back surface of said front cover when said front cover is closed and a window formed so as to enable the operation of said operation panel from the exterior.

* * * * *